(12) United States Patent
Arimoto et al.

(10) Patent No.: US 6,414,890 B2
(45) Date of Patent: Jul. 2, 2002

(54) SEMICONDUCTOR MEMORY DEVICE CAPABLE OF RELIABLY PERFORMING BURN-IN TEST AT WAFER LEVEL

(75) Inventors: Kazutami Arimoto; Hiroki Shimano, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/739,350

(22) Filed: Dec. 19, 2000

(30) Foreign Application Priority Data

Dec. 27, 1999 (JP) .......................................... 11-370286

(51) Int. Cl.[7] .................................................. G11C 7/00
(52) U.S. Cl. .................. 365/201; 365/189.09; 365/226; 365/230.06
(58) Field of Search ........................... 365/201, 189.09, 365/189.11, 230.06, 226

(56) References Cited

U.S. PATENT DOCUMENTS

| | | | |
|---|---|---|---|
| 5,513,142 A | 4/1996 | Arimoto et al. | ....... 365/189.11 |
| 5,590,079 A | * 12/1996 | Lee et al. | .................... 365/201 |
| 5,949,724 A | * 9/1999 | Kang et al. | .................. 365/201 |
| 5,949,731 A | * 9/1999 | Tsukude | ..................... 365/149 |

OTHER PUBLICATIONS

Furuyama et al., "Wafer Burn–in (WBI) Technology for RAM's," 1993 IEDM Technical Digest, pp. 639–642.

* cited by examiner

*Primary Examiner*—Son Mai
(74) *Attorney, Agent, or Firm*—McDermott, Will & Emery

(57) ABSTRACT

In a word line drive circuit for driving a word line to a boosted voltage level, a drive signal that is activated in response to a wafer burn-in signal is applied to the gate of a transistor for preventing the floating state of the word line. Even if a boost signal is transmitted to a corresponding word line through a word line driver circuit, the floating state prevention transistor can be turned off at high speed, an electric charge flow path can be cut off, and the word line can be driven reliably to the boosted voltage level. Therefore, reliable burn-in can be implemented.

16 Claims, 9 Drawing Sheets

F I G. 4
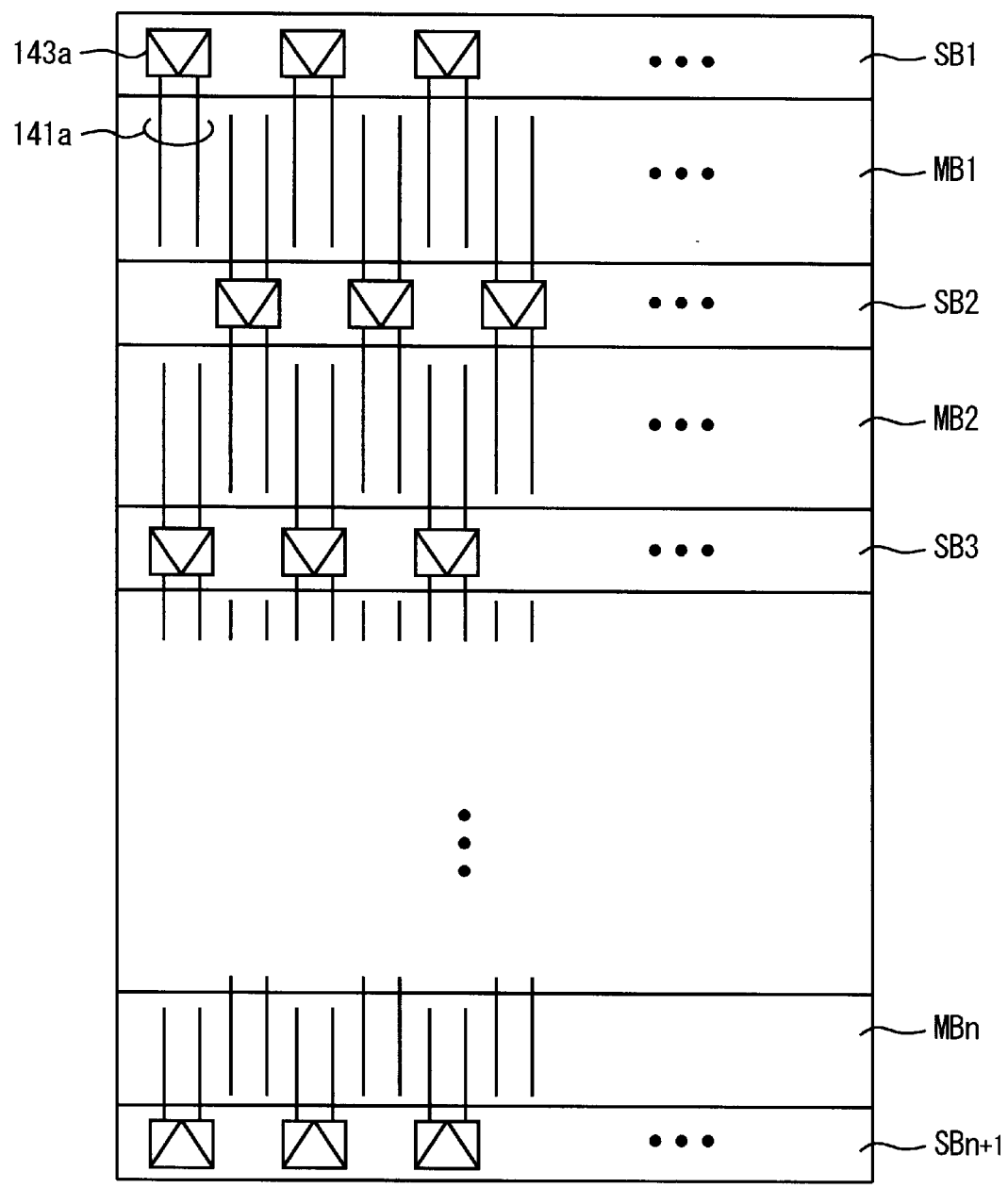
141, 143

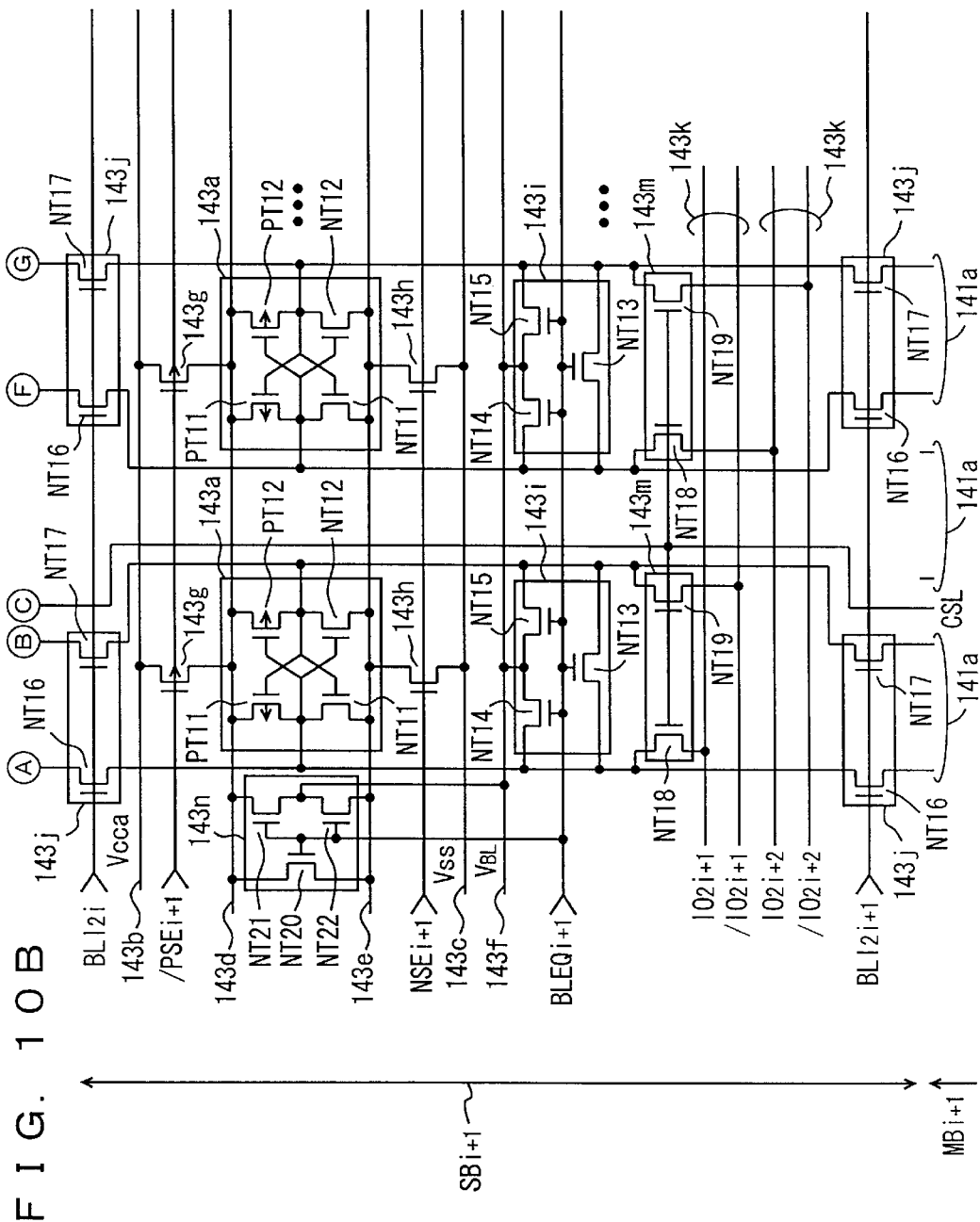

SEMICONDUCTOR MEMORY DEVICE CAPABLE OF RELIABLY PERFORMING BURN-IN TEST AT WAFER LEVEL

BACKGROUND OF THE INVENTION

1. Field of the Invention

The present invention relates to semiconductor memory devices, and more particularly to a semiconductor memory device having a test mode in which the voltages of a plurality of word lines are boosted simultaneously. More particularly, the present invention relates to a configuration for performing a burn-in test at a wafer level.

2. Description of the Background Art

In recent years, semiconductor devices in which a large number of transistors are integrated have been used for various electric equipments such as a workstation and a personal computer. In manufacturing semiconductor devices, it is necessary for reliability testing and defect screening to perform a "burn-in" for operating and testing a semiconductor device in a high temperature range with a voltage higher than a normal operation voltage applied to the power supply of the semiconductor device. Because of stress caused by the burn-in, a potential defect portion which is latent in an insulation film or the like included in the semiconductor device is acceleratingly deteriorated and rendered revealing. Thus, the defective semiconductor device can be screened. The known burn-in tests includes a burn-in test carried out after semiconductor chips are assembled into a package, and a wafer level burn-in (WBI) test carried out on a wafer having a plurality of semiconductor chips which are not assembled yet.

The wafer level burn-in test is described, for example, by T. Furuyama et al., in "Wafer Burn-In (WBI) Technology for RAM's," 1993 IEDM Tech. Digest, pp.639–642. The wafer level burn-in test has the following advantages over the conventional burn-in test. First, a semiconductor chip is not sealed in a package or a mold. It is therefore possible to perform the burn-in at a temperature higher than the tolerable (heat-resistant) temperature of the package or the mold. In addition, the burn-in voltage can be applied externally through a pad. It is therefore possible to set a higher stress electric field to shorten the burn-in time. Secondly, the wafer burn-in test is performed before a repair test for replacing a defective bit with a redundant one by laser trimming or the like. It is therefore possible to repair a defect, which is caused after the burn-in, by a subsequent repair test, improving the manufacturing yield. Thirdly, the location of a semiconductor chip with a detected defect on a wafer can be checked. By feeding back the defect information to the manufacturing line, the cause of the defect is eliminated at a wafer level and the manufacturing process can be improved easily.

A DRAM (Dynamic Random Access Memory) has memory cells each formed of one transistor/one capacitor, is inexpensive per bit, and has a structure suitable for high density. Therefore, the DRAM is utilized as a main memory for a personal computer that requires a large memory capacity. In the DRAM, the memory cells are arranged in rows and columns and each cell stores one-bit information of "0" or "1". One electrode of a memory cell capacitor is formed of a cell plate and supplied with a prescribed voltage (intermediate voltage ½ times as high as an array power supply voltage). A plurality of word lines are provided for the rows of the memory cells, and a plurality of bit line pairs are provided for the columns of the memory cells. A gate of a memory cell transistor is connected to a corresponding word line (the memory cell transistor is usually a MOS transistor, and gate electrodes and word lines are formed in the same interconnection layer). The memory cell transistor is connected between a corresponding bit line and the other electrode (storage node) of the memory cell capacitor.

In the wafer level burn-in test, all the word lines are simultaneously selected or every other word lines are simultaneously selected in a stripe manner, and the bit lines and the cell plates are externally supplied with voltages. With the external burn-in voltage, a stress voltage can be applied to the gate insulation film of a memory cell transistor, the insulation film of a memory cell capacitor, an insulation film between adjacent word lines, an insulation film between adjacent memory cells, and so on.

FIG. 1 shows a configuration of a word line drive portion in a conventional DRAM described, for example, in U.S. Pat. No. 5,513,142. In the configuration shown in FIG. 1, a word line drive circuit for driving a corresponding word line to a selected state in accordance with a word line selection signal ZWD and sub decode signals RXi and ZRXi are provided for each word line WL. Sub decode signal RXi is generated by a boost signal driver RXD which receives the decode result RXF of a prescribed number of bits of a row address. Boost signal driver RXD receives, as one operating power supply voltage, a boosted voltage Vpp higher than an array power supply voltage. Sub decode signal ZRXi is generated by an inverter INV which receives sub decode signal RXi from boost signal driver RXD. Inverter INV is formed of a CMOS inverter and receives, as one operating power supply voltage, an array power supply voltage Vcca, not shown.

Word line drive circuit DRV includes a P channel MOS transistor P1 connected between a node receiving sub decode signal RXi and a corresponding word line and receiving word line selection signal ZWD at its gate, an N channel MOS transistor N1 connected between a corresponding word line and a ground node and receiving corresponding word line selection signal ZWD at its gate, and an N channel MOS transistor N2 connected between the ground node and corresponding word line WL and receiving a complementary sub decode signal ZRXi at its gate.

Boost signal driver RXD is provided commonly to 128 word lines WL, for example. In wafer level burn-in, word line selection signals ZWD simultaneously attain a selected state or a low level, sub decode signal RXi from boost signal driver RXD attains the boosted voltage Vpp level, and complementary sub decode signal ZRXi becomes a low level. In each of word line drive circuits DRV, P channel MOS transistor P1 is rendered conductive while N channel MOS transistors N1 and N2 are rendered non-conductive, so that sub decode signal RXi at the boosted voltage Vpp level is transmitted onto each word line WL. In short, a plurality of, for example 128, word lines WL are driven simultaneously to the selected state by one boost signal driver RXD. However, the drivability of boost signal driver RXD is designed to drive one word line from a ground voltage GND to boosted voltage Vpp at a certain speed in a normal operation mode. If boost signal driver RXD comes to have unnecessarily large drivability in the normal operation mode, the power consumption in the normal operation mode and the occupied area by the driver are increased, and therefore the drivability of boost signal driver RXD is set at a necessary minimum value. Therefore, when 128 word lines WL are to be driven simultaneously to the selected state in the wafer level burn-in test, boost signal RX gradually rises and exceeds the input logic threshold of inverter circuit INV. If boost signal RXi rises gradually as shown in FIG. 2, the falling speed of complementary sub decode signal ZRXi from inverter circuit INV becomes slower. In other words, shortly before the voltage level of sub decode signal RXi exceeds input logic threshold VIT of inverter circuit INV, complementary sub decode signal ZRXi begins to fall, and the voltage level of complementary sub decode signal ZRXi gradually becomes low as the voltage level of sub decode signal RXi rises.

Complementary sub decode signal ZRXi is applied to the gate of N channel MOS transistor N2 in word line drive circuit DRV. MOS transistor N2 is turned off when the gate-to-source voltage becomes a threshold voltage Vth or lower. Therefore, when the voltage level of sub decode signal RXi rises gradually, there is a period during which MOS transistor N2 is on in word line drive circuit DRV, and electric charges from boost signal driver RXD are discharged to the ground node through 128 word line drive circuits DRV. As a result, the voltage level of word line WL does not rise to the boosted voltage Vpp level, but is saturated at a level around input logic threshold VIT of inverter circuit INV. The input logic threshold of inverter circuit INV may deviate from a set value and become higher due to variation in the manufacturing process, for example. In such a case, N channel MOS transistor N2 for discharging word line drive circuit DRV maintains its on state, and most of the charge current from sub decode signal RX at the boosted voltage Vpp level to word line WL is discharged to the ground node. Consequently, it is impossible to transmit boosted voltage Vpp to word line WL and accurately perform the burn-in at a wafer level.

N channel MOS transistor N2 is provided for the reasons described below. When word line selection signal ZWD and sub decode signal RXi are both at the low level, MOS transistors P1 and N1 are both off. At this time, corresponding word line WL enters an electrically floating state, and the voltage level is fluctuated due to noises. That may affect adjacent word lines. In order to prevent the word line from shifting to the floating state, MOS transistor N2 is turned on by complementary sub decode signal ZRXi so as to maintain the word line at the ground voltage GND level. Therefore, MOS transistor N2 is provided to guarantee regular word line selection operation in the normal operation mode, and therefore MOS transistor N2 cannot be removed.

SUMMARY OF THE INVENTION

An object of the present invention is to provide a semiconductor memory device capable of reliably driving a selected word line to a boosted voltage Vpp level in a wafer level burn-in mode.

In summary, a semiconductor memory device according to the present invention generates a signal for driving a transistor, which is provided to prevent a word line from entering a floating state, from a sub decode signal at a boosted voltage level and a voltage acceleration mode designation signal which in turn is activated in a wafer level burn-in mode.

More specifically, the semiconductor memory device according to the present invention includes a boost signal generator for generating a sub decode signal at the boosted voltage level, a drive signal generator for generating a drive signal complementary to the sub decode signal in accordance with the sub decode signal and the voltage acceleration mode designation signal that is activated in the wafer level burn-in mode, a plurality of word lines each provided for a memory cell row and connected to memory cells in a corresponding row, and word drivers provided corresponding to the plurality of word lines for driving corresponding word lines to a selected state in accordance with at least the sub decode signal and the drive signal. Each of the plurality of word driver includes a first drive transistor for transmitting, when conductive, the sub decode signal to a corresponding word line, and a second drive transistor rendered conductive in response to the drive signal for fixing, when conductive, a corresponding word line to a low level reference potential.

Since the drive signal is generated from the sub decode signal and the voltage acceleration mode designation signal, even if the sub decode signal rises to the boosted voltage level, the drive signal can be changed at a high speed in accordance with the voltage acceleration mode designation signal and the first and second transistors can be prevented from being rendered conductive at the same time in the word driver. Thus, a plurality of word lines which are selected simultaneously can be driven reliably to the boosted voltage level.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 schematically shows a configuration of the memory array and the sense amplifier group of the semiconductor memory device shown in FIG. 1.

FIG. 10B shows, in more detail, the configuration of the sense amplifier band corresponding to the sub memory blocks shown in FIG. 10A.

DESCRIPTION OF THE PREFERRED EMBODIMENTS

First Embodiment

Figure 1:
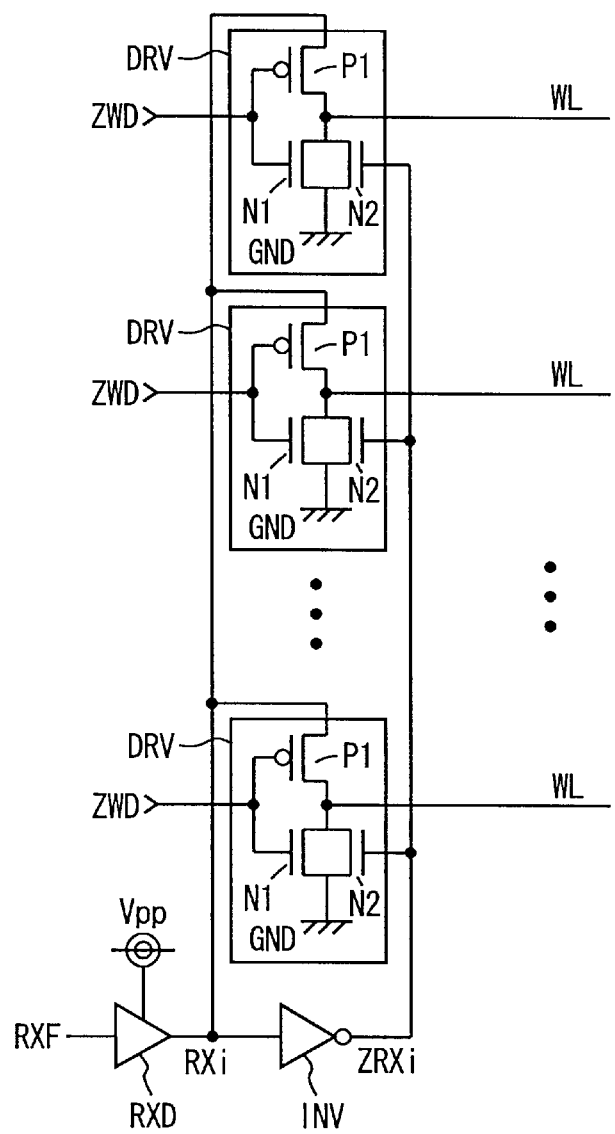
FIG. 1 shows a configuration of a conventional word driver.
Figure 2:
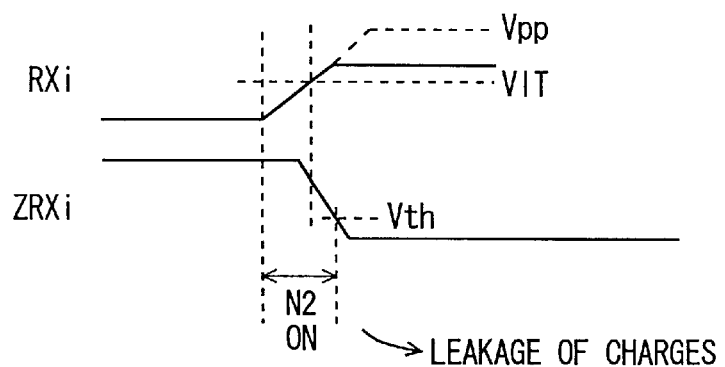
FIG. 2 is a signal waveform diagram illustrating an operation of the word driver shown in FIG. 1.
Figure 3:
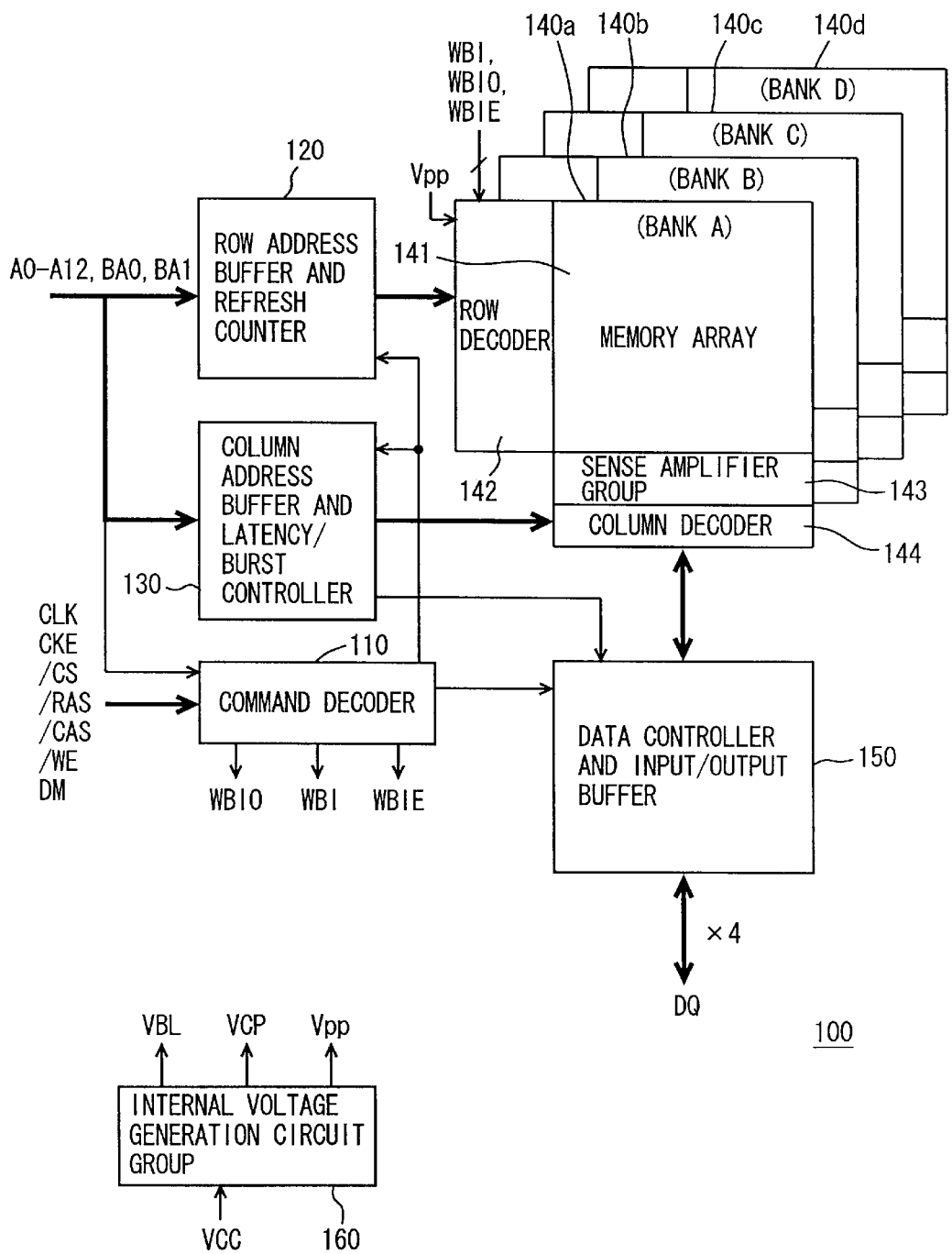
FIG. 3 schematically shows an overall configuration of a semiconductor memory device according to a first embodiment of the present invention.

FIG. 3 schematically shows an overall configuration of a semiconductor memory device according to a first embodiment of the present invention. The semiconductor memory device shown in FIG. 3 is a clock synchronous type DRAM which operates in synchronization with an external clock signal CLK.

Referring to FIG. 3, a semiconductor memory device 100 includes memory mats 140a to 140d which form banks A to D, respectively. Memory mats 140a to 140d have the same configuration. The configuration of memory mat 140a is representatively shown in FIG. 3. Each of memory mats 140a to 140d includes a memory array 141 including memory cells arranged in rows and columns, a row decoder 142 for driving an addressed row in memory array 141 to a selected state, a sense amplifier group 143 having a plurality of sense amplifiers for sensing, amplifying and latching memory cell data on a selected row of memory array 141, and a column decoder 144 for selecting an addressed column in memory array 141 in accordance with an address signal.

In a wafer level burn-in mode, row decoder 142 simultaneously drives a plurality of word lines in memory array 141 to the selected state in accordance with wafer burn-in signals WBI, WBIO, WBIE described in detail below. In a normal operation mode, row decoder 142 drives a word line corresponding to an addressed row in memory array 141 to the selected state in accordance with an applied address signal. It is noted that a word line is provided for each memory cell row and a bit line pair is provided for each memory cell column in memory array 141.

DRAM 100 includes a command decoder 110 for latching control signals (a clock enable signal CKE, a chip select signal ICS, a row address strobe signal/RAS, a column address strobe signal /CAS, a write enable signal /WE and a data mask signal DM, for example) applied externally in synchronization with an externally applied clock signal CLK, decoding the control signals and generating an operation mode designation signal in accordance with the decode result. Based on a combination of the logic levels of a plurality of control signals, an operation command for designating an operation mode is formed. The commands applied to semiconductor memory device 100 include a bank activation command for activating a bank, a read command for designating data reading, a write command for designating data writing, a bank precharge command for returning a bank to a precharge state, a CBR refresh command for performing a refresh operation, a self refresh command for internally performing a refresh operation at a prescribed period, and a wafer burn-in command for designating the wafer level burn-in mode. The wafer burn-in command is defined by a combination of the external control signals and a prescribed bit out of address signal bits A0 to A12.

When command decoder 110 is supplied with the wafer burn-in command, it activates wafer burn-in designation signal WBI and drives one or both of wafer burn-in word line designation signals WBIO and WBIE each designating a selected word line group. Command decoder 110 includes a latch circuit, and latches signals WBI, WBIE and/or WBIO during the wafer burn-in mode. Signals WBIO and WBIE are utilized to control a MOS transistor for preventing the floating state of a word line. The operation mode designation signal which is generated as a result of decoding a command from command decoder 110 is applied to a bank control circuit, not shown, and a designated operation mode is performed in a selected bank.

Semiconductor memory device 100 further includes a row address buffer which receives a plurality of address signal bits A0 to A12 and bank designating bank address signal bits BA0 to BA1 which are applied externally, and generates internal row address signal bits and internal bank address signal bits for designating a selected row, and a refresh counter which generates a refresh address in the refresh mode. When the operation mode designation signal from command decoder 110 designates that the bank activation command is applied, row address buffer and refresh counter 120 latches and supplies external address signal bits A0 to A12 and bank address signals BA0 to BA1 as internal row address signal bits and internal bank address signal bits, respectively, to a prescribed internal circuit such as row decoder 142.

When the internal control signal from command decoder 110 designates that the refresh command (CPR refresh or self refresh command) is applied to command decoder 110, row address buffer and refresh counter 120 neglects externally applied address signal bits A0 to A12 and bank address signal bits BA0 and BA1, and generates a row address signal and a bank address signal from the internal refresh address counter and supplies them to row decoder 142, for example.

Semiconductor memory device 100 further includes a column address buffer and latency/burst controller 130 which latches external address signal bits A0 to A12 and bank address signals BA0 to BA1 and generates internal column address signal bits and internal bank address signal bits in response to a column access designation signal from command decoder 110. When the read command or the write command is applied to command decoder 110 and the column access designation signal is applied from command decoder 110, column address buffer and latency/burst controller 130 latches externally applied address signal bits A0 to A12 and bank address signals BA0 to BA1 in synchronization with external clock signal CLK, generates the internal column address signal bits and the internal bank address signal bits, and supplies them to column decoder 144, for example.

In response to an internal mode register set designation signal which is activated when a mode register set command is applied to command decoder 110, column address buffer and latency/burst controller 130 stores prescribed bits (for example, bits A4 to A6) of external address signal bits A0 to A12 in a mode register (not shown) and sets a CAS latency (column latency), and also stores other prescribed bits (for example, bits A0 to A2) in the mode register and sets a burst length. It is noted that the CAS latency (column latency) represents the number of cycles of clock: signal CLK which are required after the read command is applied till valid data is output externally. It is also noted that the burst length represents the number of data read or written successively when the read command or the write command is applied.

By utilizing bank address signal bits BA0 to BA1, a memory cell at a different address can be selected in each of banks A to D. Furthermore, the memory array can be activated/inactivated on a bank basis.

Semiconductor memory device 100 further includes a data controller and input/output buffer 150 which performs data writing and reading to and from a selected memory cell in response to the operation mode designation signal from command decoder 110. In a data reading mode (when the read command is applied), data controller and input/output buffer 150 transfers and buffers a selected memory cell of memory array 141 in a selected bank to generate external read data DQ in accordance with a read operation mode designation signal from command decoder 110 as well as the CAS latency and the burst length which are set in column address buffer and latency/burst controller 130 and in synchronization with clock signal CLK.

When the internal control signal from command decoder 110 is an internal read operation mode designation signal (when the read command is applied), data controller and input/output buffer 150 begins to output read data DQ at a time point when a cycle of clock signal CLK corresponding to a GAS latency value has elapsed since read command application. In outputting read data DQ, data controller and input/output buffer 150 can serially output, to DQ pins of multiple bits (for example, 4 bits), data of memory cells selected by corresponding column decoder 144 from memory array 141 in a selected bank (data controller and input/output buffer 150 reads out data for a burst length by sequentially changing a column address in each clock cycle, with a column address signal at the time of read command application being a leading address).

In a data writing operation mode (when the write command is applied), data controller and input/output buffer 150 supplies externally applied data DQ to a selected memory cell of memory array 141 in a selected bank in accordance with a write operation mode designation signal from command decoder 110, in accordance with the burst length data set in column address buffer and latency/burst controller 130, and in synchronization with clock signal CLK. In short, in data writing, data controller and input/output buffer 150 sequentially receives write data for a burst length, externally applied to the DQ pins, in synchronization with clock signal CLK and applies the write data to a column selected by column decoder 144 of memory array 141 in a selected bank in accordance with an internal write operation mode designation signal from command decoder 110. In data writing, data controller and input/output buffer 150 can mask writing to a part of bits of serially applied write data in accordance with data mask signal DM.

Semiconductor memory device 100 further includes an internal voltage generation circuit group 160 which receives an external power supply voltage Vcc, and outputs a boosted voltage Vpp higher than external power supply voltage Vcc or an internal power supply voltage (array power supply voltage applied to a memory array), a bit line precharge voltage VBL that is an intermediate voltage (Vcca+Vss)/2 between array power supply voltage Vcca supplied to a memory array and the ground voltage, and a cell plate voltage VCP that has a level of the voltage (Vcca+Vss)/2 and is supplied to a cell plate of a memory cell capacitor. Array power supply voltage Vcca is generated by internally down-converting external power supply voltage Vcc. Boosted voltage Vpp may be generated by boosting array power supply voltage Vcca or by boosting external power supply voltage VCC. Boosted voltage Vpp is transmitted through row decoder 142 for a selected bank onto a selected word line.

FIG. 4 schematically shows a configuration of memory array 141 and sense amplifier group 143 shown in FIG. 3. Referring to FIG. 4, memory array 141 is divided into a plurality of memory blocks MB1 to MBn in the column direction. Each of memory blocks MB1 to MBn has a plurality of memory cells arranged in rows and columns, and a bit line pair 141a is provided for each column.

Between memory blocks MB1 to MBn, sense amplifier bands SB2 to SBn are provided each of which includes a plurality of sense amplifiers. On the outer sides of memory blocks MB1 and MBn, sense amplifier bands SB1 and SB (n+1) are provided, respectively. In each of sense amplifier bands SB1 to SB (n+1), sense amplifiers 143a are provided in every other columns of a corresponding memory block. A sense amplifier band is shared by memory blocks provided on its both sides in the column direction. In other words, the semiconductor memory device adopts the "shared sense amplifier configuration."

Bit line pairs 141a are provided to extend in the memory cell column direction and connected to memory cells in corresponding columns of corresponding memory blocks. Sense amplifiers 143a included in each of sense amplifier bands SB1 to SB(n+1) are arranged in alignment in the memory cell row direction.

Figure 5:
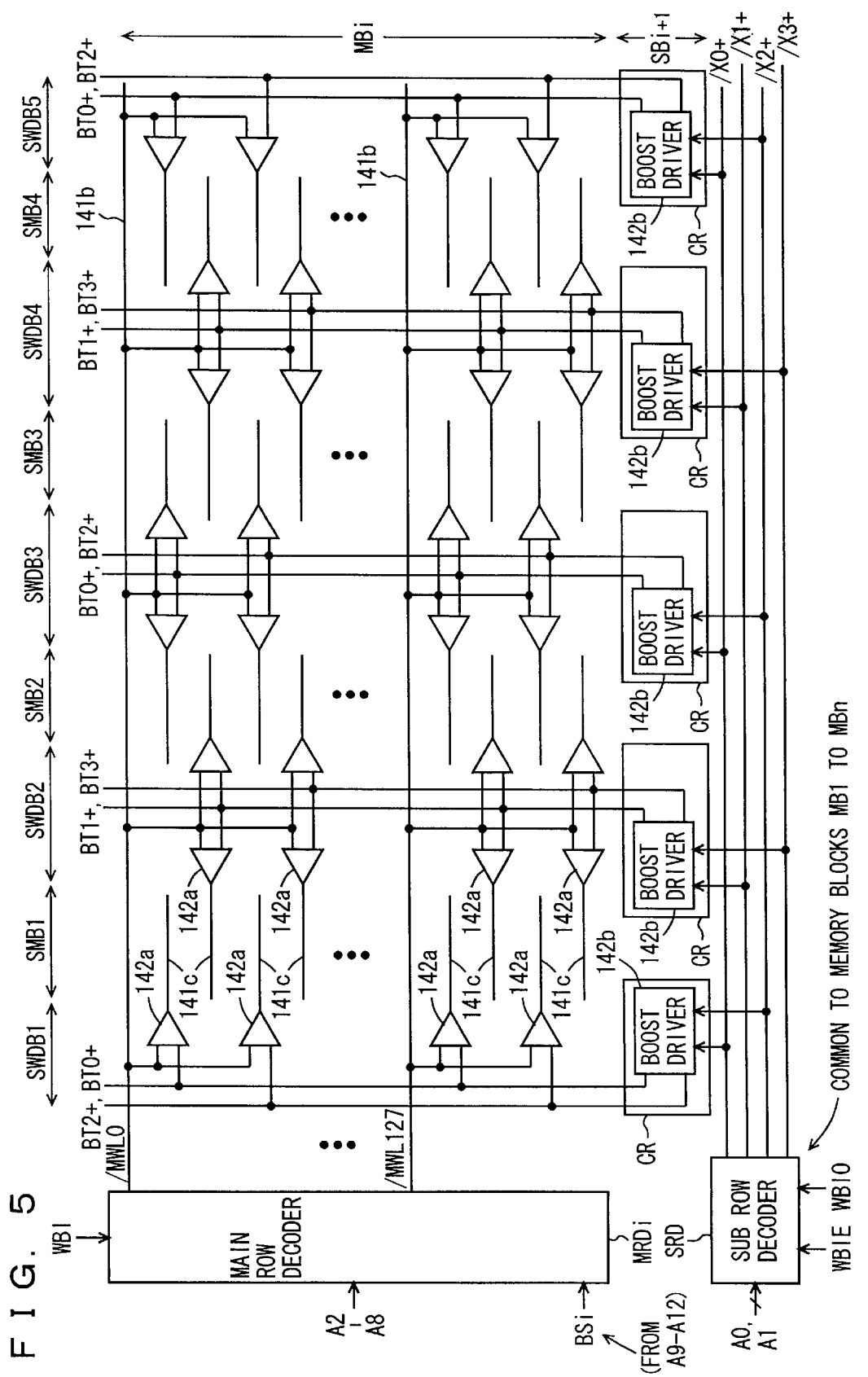
FIG. 5 schematically shows a configuration of the memory block and the sense amplifier band shown in FIG. 4.

FIG. 5 schematically shows a configuration of one memory block MBi of memory blocks MB1 to MBn shown in FIG. 4 and row decoder 142. Referring to FIG. 5, memory block MBi is divided into a plurality of sub memory blocks SMB1 to SMB4 in the row direction. Commonly to sub memory blocks SMB1 to SMB4, main word lines 141b are provided extending in the row direction. For example, 128 main word lines 141b are provided. Word line selection signals /MWL0 to /MWL127 from a main row decoder MRDi provided corresponding to memory block MBi are transmitted on main word lines 141b. Main row decoder MBi is included in row decoder 142 and is activated in response to a block selection signal. In the normal operation mode, main row decoder MRDi is activated, when memory block selection signal BSi is activated, to decode internal row address signal bits A2 to A8 for driving one of word line selection signals /MWL0 to /MWL127 of a plurality of (128) main word lines 141b to an active state (low level). Word line selection signals /MWL0 to /MWL127 are at the boosted voltage Vpp level when not selected. Block selection signal BSi is generated by decoding row address signal bits A9 to A12.

In the wafer level burn-in mode, main row decoder MRDi sets all word line selection signals /MWL0 to /MWL127 to the selected state or the low level in response to activation of wafer burn-in signal WBI, and responsively all main word lines 141b are driven to the selected state in memory block MBi.

Row decoder 142 further includes a plurality of sub word driver bands SWDB1 to SWDB5 in addition to main row decoder MRDi. Memory block MBi is divided into the above described sub memory blocks SMB1 to SMB4 by sub word driver bands SWDB1 to SWDB5. Each of sub memory blocks SMB1 to SMB4 includes a plurality of memory cells arranged in rows and columns, and a plurality of sub word lines 141c provided corresponding to the rows of the memory cells and connected to the memory cells in corresponding rows. Sub word line 141c is provided extending in the memory cell row direction within a corresponding sub memory block.

Each of sub word driver bands SWDB1 to SWDB5 includes sub word drivers 142a provided on both sides of a sub memory block in the row direction alternately in the memory cell column direction. Each of sub word drivers 142a is provided corresponding to sub word line 141c and connected to the corresponding sub word line.

In each of sub memory blocks SMB1 to SMB4, four sub word lines 141c are provided corresponding to one main word line 141b. Sub word drivers 142a provided corresponding to a set of four sub word lines are coupled commonly to the same main word line 141b. In order to drive one of sub word drivers 142a provided corresponding to the set of four sub word lines to a selected state, boost signals BT0+ to BT3+ are applied to respective four sub word drivers in the set. Boost signals BT0+ to BT3+ each are at a boosted voltage level higher than array power supply voltage Vcca. The symbol "+" indicates a signal at a boosted voltage level. Sub word driver 142a drives a corresponding sub word line to the selected state in accordance with a corresponding word line selection signal /MWLj and a corresponding boost signal BTk+. In other words, sub word driver 142a transmits a boost signal at the boosted voltage Vpp level onto a corresponding sub word line when the voltage on corresponding main word line 141b becomes the low level and a corresponding boost signal is at the selected state or boosted voltage Vpp level.

Row decoder 142 further includes a sub row decoder SRD provided commonly to memory blocks MB1 to MBn. Sub row decoder SRD is provided for each of banks 140a to 140d, and activated on a bank basis in the normal operation mode. In the normal operation mode, when a corresponding bank 140 (140a to 140d) is activated, sub row decoder SRD drives one of sub decode signals /X0+ to /X3+ to a selected state or low level in accordance with applied address signal bits. In this embodiment, sub row decoder SRD renders one of sub decode signals /X0+ to /X3+ to the selected state or the low level in accordance with lower order 2 bits A0–A1 of an address, and maintains remaining sub decode signals at a non-selected state or the boosted voltage Vpp level.

In the wafer level burn-in mode, sub row decoder SRD drives only even-numbered sub decode signals /X0+ and /X2+, or only odd-numbered sub decode signals /X1+ and /X3+ of sub decode signals /X0+ to /X3+, or drives all sub decode signals /X0+ to /X3+ to the selected state or the low level in response to wafer burn-in signals WBIE and WBIO. More specifically, when wafer burn-in signals WBIE and WBIO are at the high and low levels, respectively, sub row decoder SRD sets only even-numbered sub decode signals /X0+ and /X2+ of sub decode signals /X0+ to /X3+ to the low level. When wafer burn-in signals WBIE and WBIO are at the low and high levels, respectively, sub row decoder SRD drives only odd-numbered sub decode signals /X1+ and /X3+ to the low level. When wafer burn-in signals WBIE and WBIO are both at the high level, sub row decoder SRD sets all sub decoder signals /X0+ to /X3+ to the low level.

In the wafer level burn-in mode, all word line selection signals /MWL0 to /MWL127 are set at the selected state or the low level by main row decoder MRDi in memory block MBi. By generating sub decode signals using wafer burn-in signals WBIE and WBIO, only even-numbered sub word lines, only odd-numbered sub word lines or all the sub word lines can be set at the selected state in memory block MBi.

Sub row decoder SRD is provided for each memory bank. Therefore, in the wafer level burn-in mode, main word lines 141b of all memory blocks MB1 to MBn in one bank may be driven to the selected state. Even in the wafer level burn-in mode, block selection signal BSi may be validated to activate/inactivate main word lines and sub word lines on a memory block basis in a designated bank. Furthermore, the burn-in may be performed simultaneously for all the banks or performed independently of the banks. By selectively activating/inactivating block selection signal BSi and bank address signal bits BA0, BA1 using wafer burn-in signal WBI, burn-in on a memory block basis, or on a bank basis and simultaneous burn-in on all the banks can be implemented easily.

It is noted that wafer burn-in signals WBIE and WBIO are generated by command decoder 110 shown in FIG. 3 as described above. When at least one of wafer burn-in signals WBIE and WBIO attains the high level, wafer burn-in signal WBI becomes the selected state or the high level. Wafer burn-in signals WBIE and WBIO are signals for simultaneously selecting even-numbered sub word lines and odd-numbered sub word lines, respectively. Therefore, when only even-numbered sub word lines are to be selected simultaneously in the wafer level burn-in mode, wafer burn-in signals WBI and WBIE become the active state or the high level and wafer burn-in signal WBIO becomes the inactive state or the low level. When only odd-numbered sub word lines are to be selected simultaneously, wafer burn-in signals WBI and WBIO become the active state or the high level and wafer burn-in signal WBIE becomes the inactive state or the low level. When all the word lines are to be selected simultaneously, wafer burn-in signals WBI, WBIE and WBIO all become the active state or the high level.

In the normal operation, wafer burn-in signals WBI, WBIE and WBIO are all at the inactive state or the low level. Boost drivers 142 for transmitting boost signals BT0+ to BT3+ to word drivers 142a of sub word driver bands SWDB1 to SWDB5 in memory block MBi are provided in crossing regions CR of the sub word driver bands and sense amplifier bands SBi+1. A sense amplifier, not shown, is provided in sense amplifier band SBi+1. Boost drivers 142b, of which configuration is described later, generate boost signals BT0+ to BT3+ to be transmitted to the sub word drivers in accordance with sub decode signals /X0+ to /X3+ from sub row decoder SRD. In sub word driver bands SWDB1 to SWDB5, a boost driver for generating even-numbered boost signals BT0+, BT2+ and a boost driver for generating odd-numbered boost signals BT1+, BT3+ are provided alternately. By arranging boost drivers 142b for each memory block MBi, boost signals BT0+ to BT3+ at the boosted voltage Vpp level can be transmitted to sub word drivers 142a even in a configuration in which sub decode signals /X0+ to /X3+ at the boosted voltage Vpp level are transmitted for a long distance.

Furthermore, activation/inactivation of boost drivers 142b may be controlled on a memory block basis in accordance with block selection signal BSi.

Boost drivers 142b each drive 128 sub word drivers in corresponding memory block MBi in accordance with one boost signal.

Figure 6:
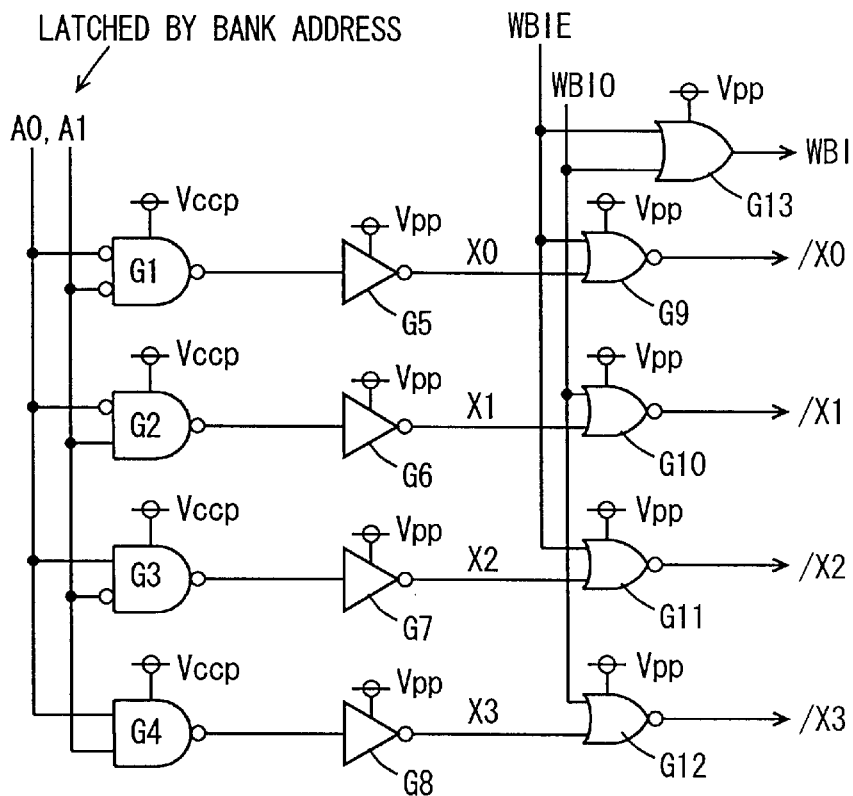
FIG. 6 shows one example of a configuration of the sub row decoder shown in FIG. 5.

FIG. 6 shows one example of a configuration of sub row decoder SRD shown in FIG. 5. In FIG. 6, sub row decoder SRD includes gate circuits G1 to G4 each receiving lower order address bits A1 and A0, and inversion circuits G5 to G8 having a level conversion function (hereinafter, referred to as level converting inversion circuits G5 to G8) for inverting output signals of gate circuits G1 to G4 and converting the ground voltage level thereof to the boosted voltage level. Gate circuit G1 outputs a low level signal when address bits A0 and A1 are both at the low level. Gate circuit G2 outputs a low level signal when address bits A0 and A1 are at the low and high levels, respectively. Gate circuit G3 outputs a low level signal when address bits A0 and A1 are at the high and low levels, respectively. Gate circuit G4 outputs a low level signal when address bits A0 and A1 are both at the high level. Gate circuits G1 to G4 receive a peripheral power supply voltage Vccp, for example, as one operating power supply voltage.

Level converting inversion circuits G5 to G8 converts the low level signals from gate circuits G1 to G4 to signals at the boosted voltage Vpp level for output.

Sub row decoder SRD further includes an NOR gate G9 receiving an output signal of level converting inversion circuit G5 and wafer burn-in signal WBIE to generate sub decode signal /X0, an NOR gate G10 receiving wafer burn-in signal WBIO and an output signal X1 of level converting inversion circuit G6 to generate sub decode signal /X1, an NOR gate G11 receiving wafer burn-in signal WBIE and an output signal X2 of level converting inversion circuit G7 to generate sub decode signal /X2, and an NOR gate G12 receiving an output signal X3 of level converting inversion circuit G8 and wafer burn-in signal WBIO to generate sub decode signal /X3. NOR gates G9 to G12 receive boosted voltage Vpp as one operating power supply voltage.

Wafer burn-in signal WBI is generated from an OR gate G13 receiving wafer burn-in signals WBIE and WBIO.

In the normal operation mode, wafer burn-in signals WBI, WBIO and WBIE are all at the low level, and NOR gates G9 to G12 operate as inverter circuits. Gate circuits G1 to G4 output low level signals when corresponding address bits are both in the selected state. Level converting inversion circuits G5 to G8 invert the output signals of gate circuits G1 to G4 to generate signals X0 to X3. Therefore, one of signals X0 to X3 is driven to the boosted voltage Vpp level in the normal operation mode. Due to NOR circuits G9 to G12, one of sub decode signals /X0 to /X3 attains the low level and the remaining signals maintain the boosted voltage Vpp level.

In the wafer burn-in mode, sub decode signals /X0 to /X3 are driven to the selected state in accordance with wafer burn-in signals WBIE and WBIO. More specifically, when wafer burn-in signal WBIE is at the high level, sub decode signals /X0 and /X2 become the low level. When wafer burn-in signal WBIO is in the selected state or at the high level, sub decode signals /X1 and /X3 become the selected state or the low level. Therefore, by using wafer burn-in signals WBIE and WBIO, odd-numbered, even-numbered or all sub decode signals /X0 to X3 can be driven to the selected state. When one of wafer burn-in signals WBIE and WBIO attains the high level, wafer burn-in signal WBI is driven to the selected state or the high level. The number of selected sub word lines can be changed between the normal operation mode and the wafer level burn-in mode.

In main row decoder MRDi, when wafer burn-in signal WBI attains the high level, word line selection signals MWL0 to /MWL127 are all driven to the low level. This is implemented easily by taking a logic of wafer burn-in signal WBI and the output signal of the decode circuit provided for each main word line. For. example, it is sufficient to provide an NOR gate to generate word line selection signal /MWL (although it is required for the decode circuit to output a high level signal when selected). If the output signal of the decode circuit becomes the low level when selected, provision of OR circuits, which receive wafer burn-in signal WBI at respective one-inputs, in a main row decoder input portion enables the address signal bits to be driven to the selected state through the OR gate.

Figure 7:
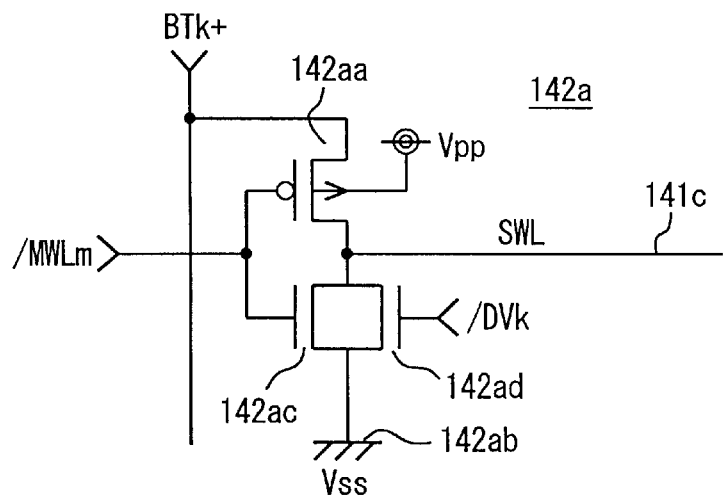
FIG. 7 schematically shows a configuration of the sub word driver shown in FIG. 5.

FIG. 7 shows a specific configuration of sub word driver 142*a* shown in FIG. 5. In FIG. 7, sub word driver 142*a* includes a P channel MOS transistor 142*aa* connected between a boost signal supply node and corresponding sub word line 141*c* and receiving word line selection signal /MWLm at its gate, an N channel MOS transistor 142*ac* connected between sub word line 141*c* and a ground node 142*ab* and receiving word line selection signal MWLm at its gate, and an N channel MOS transistor 142*ad* connected between sub word line 141*c* and ground node 142*ab* and receiving a drive signal /DVk at its gate. Boost signal BTk+ is applied to the boost signal supply node. Boosted voltage Vpp is applied to the back gate of P channel MOS transistor 142*aa*. The sources of MOS transistors 14*ac* and 142*ad* are connected to ground node 142*ab* and supplied with ground voltage Vss. However, in order to maintain a sub word line selection signal SWL on non-selected sub word line 141*c* at a negative voltage level so as to suppress a subthreshold leakage current of a memory cell, a negative voltage Vbb may be applied to node 142*ab*.

Drive signal /DVk has only to become a low level as boost signal BTk+ rises toward boosted voltage Vpp, and that low level may be a voltage level lower than the low level potential of a (sub) word line.

Each of drive signals /DV0 to /DV3 is driven to the low level in response to activation of wafer burn-in signal WBIE or WBIO. When wafer burn-in signal WBIE is at the high level, even-numbered drive signals /DV0 and /DV2 are set to the low level. When wafer burn-in signal WBIO is at the high level, odd-numbered drive signals DV1 and /DV3 are driven to the low level.

Figure 8:
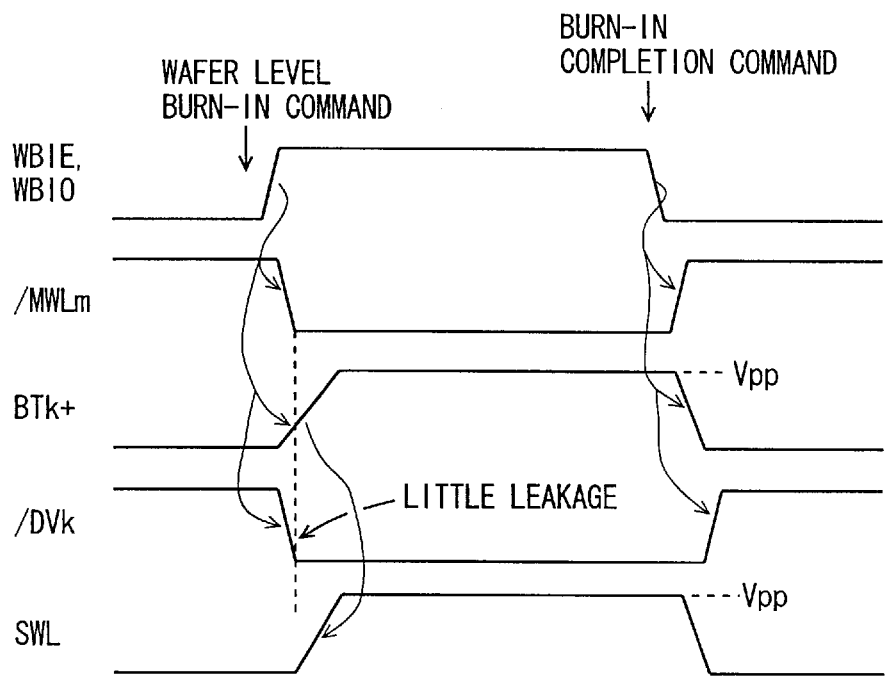
FIG. 8 is a signal waveform diagram illustrating an operation of the circuits shown in FIGS. 6 and 7.

FIG. 8 is a signal waveform chart illustrating an operation of sub word driver 142*a* shown in FIG. 7. Referring to FIG. 8, an operation of sub word driver 142*a* shown in FIG. 7 when sub word line 141*c* is driven to the selected state will be described in the following.

When the wafer level burn-in command is applied, command decoder 110 drives wafer burn-in signals WBIE and/or WBIO to the selected state or the high level. In accordance with wafer burn-in signals WBIE and/or WBIO, word line selection signal /MWLm from the main row decoder is driven to the selected state or the low level at high speed.

Meanwhile, in accordance with sub decode signals /X0+ to /X3+ which are generated from the sub row decoder in accordance with burn-in signals WBIE and WBIO, boost driver 142*b* shown in FIG. 5 gradually drives corresponding boost signal BTk to the boosted voltage Vpp level. At this time, drive signal DVk is driven to the low level at high speed in accordance with wafer burn-in signal WBIE or WBIO. Therefore, boost signal BTk+ is transmitted onto sub word line 141*c* through P channel MOS transistor 142*aa*, and when the voltage level of sub word line selection signal SWL on sub word line 141*c* begins to rise gradually, N channel MOS transistor 142*ab* is in the off state. Since word line selection signal /MWLm is driven to the low level, N channel MOS transistor 142*ac* is in the off state.

Therefore, the current path from sub word line 141*c* to ground node (or negative voltage node) 142*ab* is cut off. Thus, electric charges of boost signal BTk+ do not flow out, and sub word line selection signal SWL is driven reliably to the boosted voltage Vpp level in accordance with boost signal BTk+. More specifically, by generating drive signal /DVk in accordance with wafer burn-in signals WBIE and WBIO, the drop in the Vpp voltage level can be suppressed and sub word line 141*c* can be driven reliably to the boosted voltage Vpp level when sub word line 141*c* is to be driven to the selected state.

Figure 9:
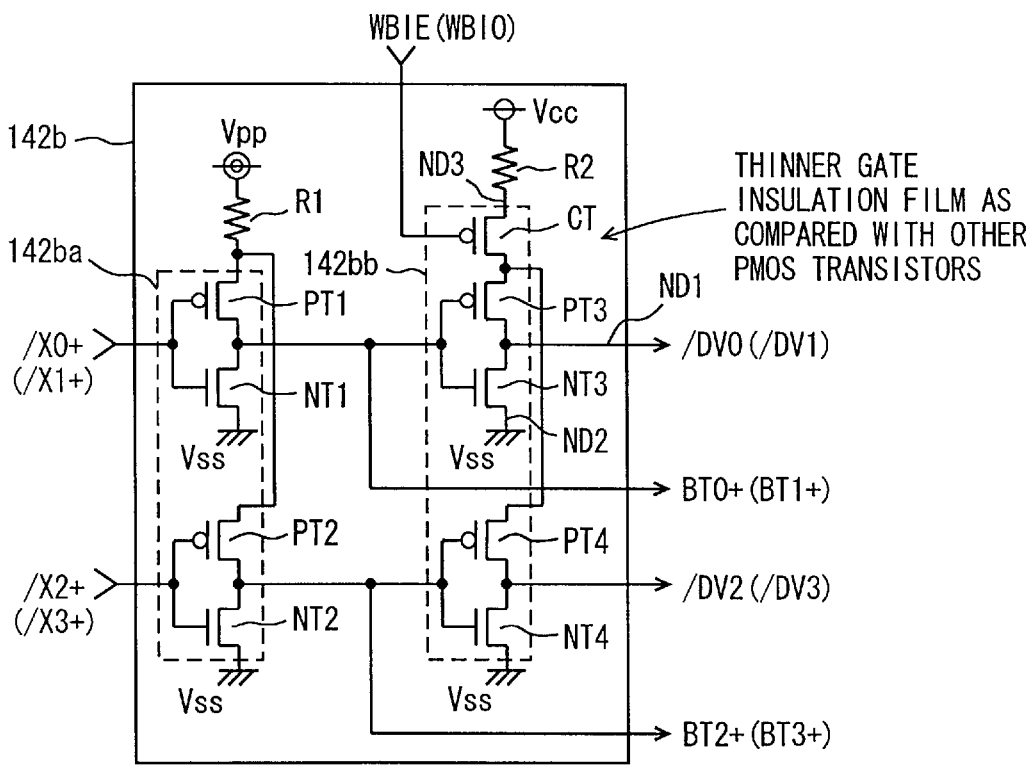
FIG. 9 shows a configuration of the boost driver shown in FIG. 5.

FIG. 9 shows a configuration of boost driver 142*b* shown in FIG. 5. Boost driver 142*b* for generating even-numbered boost signals BT0+, BT2+ and drive signals /DV0, /DV2 and boost driver 142*b* for generating odd-numbered boost signals BT1+, BT3+ and odd-numbered driver signals /DV1, /DV3 have the same configuration. The differences are whether applied sub decode signals are even-numbered sub decode signals /X0+, /X2+ or odd-numbered sub decode signals /X1+, /X3+, and which of burn-in signals WBIE and WBIO is applied. Therefore, FIG. 9 shows a configuration of boost driver 142*b* for generating even-numbered signals. As to the boost driver for generating odd-numbered signals, the signals are shown in parentheses.

In FIG. 9, boost driver 142*b* includes a boost signal generator 142*ba* for generating boost signals BT0+ and BT2+ (or BT1+ and BT3+) in accordance with sub decode signals /X0+ and /X2+ (or /X1+ and /X3+), respectively, and a drive signal generator 142*bb* for generating drive signals /DV0 and /DV2 (or /DV1 and /DV3) in accordance with boost signals BT0+and BT2+ (or BT1+ and BT3+) and wafer burn-in signal WBIE (or WBIO).

Boost signal generator 142*ba* receives boosted voltage Vpp through a power supply interconnection resistance R1 as an operating power supply voltage, inverts sub decode signals /X0+ and /X2+ (or /X1+ and /X3+), and generates boost signals BT0+ and BT2+ (or BT1+ and BT3+). Sub decode signals /X0+ to /X3+ are generated in accordance with row address signal bits and wafer burn-in signals WBIE and WBIO, and boost signals BT0+ to BT3+ are also generated in accordance with address signal bits and wafer burn-in signals WBIE and /WBIO.

Boost signal generator 142ba includes MOS transistors PT1 and NT1 which form a CMOS inverter circuit for inverting sub decode signal /X0+ (or /X1+), and MOS transistors PT2 and NT2 which form a CMOS inverter circuit for inverting sub decode signal /X2+ (or /X3+). Resistance R1 is a parasitic resistance of a power supply interconnection line for transmitting boosted voltage Vpp, and therefore it is small resistance. Therefore, boost signals BT0+ and BT2+ (or BT1+ and BT3+) can be driven reliably to the boosted voltage Vpp level without voltage drop across the resistance R1.

Drive signal generator 142bb includes MOS transistors PT3 and NT3 which form a CMOS inverter circuit for inverting boost signal BT0+ (or BT1+) and generating drive signal /DV0 (or /DV1) at a node ND1, MOS transistors PT4 and NT4 which form a CMOS inverter circuit for inverting boost signal BT2+ (or BT3+) and generating drive signal /DV2 (or /DV3), and a cut-off transistor CT for transmitting power supply voltage Vcc to the source nodes of MOS transistors PT3 and PT4 in accordance with wafer burn-in signal WBIE (or WBIO). Cut-off transistor CT is formed of a P channel MOS transistor, enters an off state when wafer burn-in signal WBIE (or WBIO) is at the high level, and has a function of helping MOS transistors NT3 and NT4 drive the drive signals /DV0 and /DV2 (/DV1 and /DV3) to the ground voltage level when boost signals BT0+ and BT2+ (or BT1+ and BT3+) rise to the high level. Cut-off transistor CT receives power supply voltage Vcc at its source through a power supply interconnection resistance R2 and a node ND3. Power supply voltage Vcc may be peripheral power supply voltage Vccp.

By providing cut-off transistor CT commonly to the CMOS inverter circuits for generating drive signals /DV0 and /DV2 (or /DV1 and /DV3), the area increase can be suppressed. However, cut-off transistor CT may be provided for each of the CMOS inverter circuits for generating drive signals /DV0 and /DV2 (or /DV1 and /DV3), respectively.

In conventional configurations, cut-off transistor CT is not provided and the drive signals (or sub decode signals) are generated in accordance with boost signals BT0+ and BT2+ (or BT1+ and BT3+). However, by providing cut-off transistor CT, a path through which an operating current flows in drive signal generator 142bb, is cut off in the wafer burn-in mode, MOS transistors NT3 and NT4 are turned on when their respective gate-to-source voltages rise to their respective threshold voltages or higher, and drive signals /DV0 and /DV2 (or /DV1 and /DV3) are discharged to the ground voltage level. Thus, N channel MOS transistor 142ad shown in FIG. 7 can be turned off reliably and sub word line selection signal SWL can be driven reliably to the boosted voltage Vpp level.

By making the gate insulation film of cut-off transistor CT thinner than the gate insulation films of other P channel MOS transistors PT1 to PT4, the absolute value of the threshold voltage of cut-off transistor CT can be made smaller, cut-off transistor CT can perform the switching operation at high speed in accordance with wafer burn-in signal WBIE (or WBIO), and when made conductive, cut-off transistor CT is turned on more deeply so as to be able to supply current from power supply node ND3 to a corresponding CMOS inverter circuit and to raise drive signals /DV0 and /DV2 (or /DV1 and /DV3) to the non-selected state at high speed.

Furthermore, when wafer burn-in signal WBIE (or WBIO) rises to the high level, cut-off transistor CT is turned off at high speed so as to be able to cut off the operating current of drive signal generator 142bb and to drive the drive signals /DV0 and /DV2 to the low level at high speed.

Figure 10A:
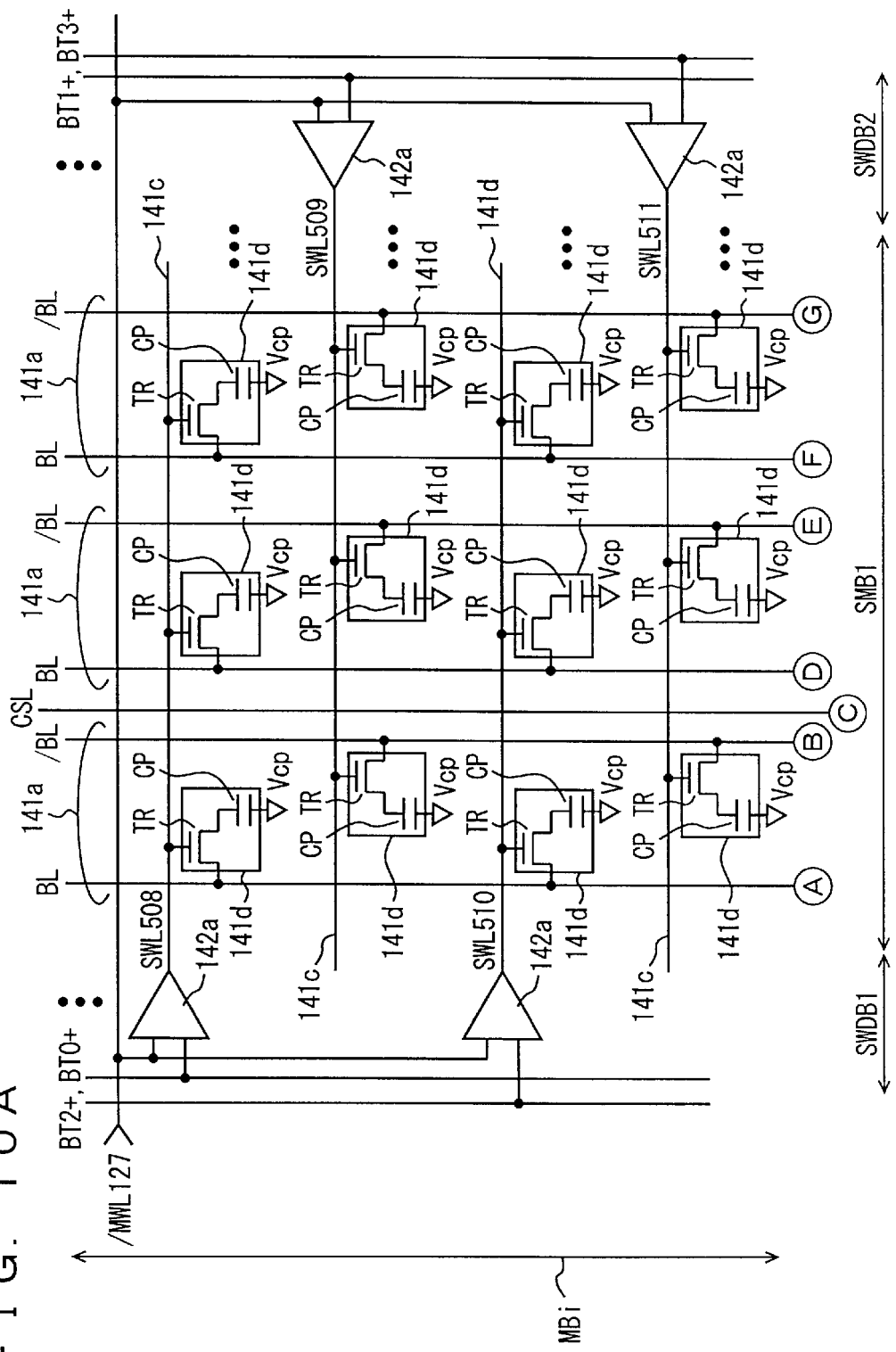
FIG. 10A shows, in more detail, the configuration of the sub memory block.

FIGS. 10A and 10B show, in more detail, the configuration of memory block MBi and sense amplifier band SBi+1. In FIGS. 10A and 10B, the configuration of sub memory block SMBi will be shown in more detail. In FIGS. 10A and 10B, associated nodes to which bit line nodes and column selection line CSL are connected are denoted by the same reference characters A to E.

In FIG. 10A, sub word lines 141c receiving sub word line selection signal SWL are provided for main word line 141b transmitting word line selection signal /MWL127. Four sub word lines 141c are provided for one main word line 141b. A bit line pair 141a is provided in the direction crossing main word line 141b and sub word lines 141c. Bit line pair 141a includes bit lines BL and /BL. A memory cell 141d includes a memory cell capacitor CP receiving a cell plate voltage VCP at its cell plate node, and a memory transistor TR connecting a corresponding memory cell capacitor to a corresponding bit line BL (or /BL) in response to the signal SWL on a corresponding sub word line.

Sub word driver bands SWDB1 and SWDB2 are provided on both sides of sub memory block SMB1 in the row direction. Sub word drivers 142a are provided alternately on both sides of sub word lines 141c in the row direction. Boost signals BT0+ and BT2+ are transmitted to sub word driver band SWDB1, and boost signals BT1+ and BT3+ are transmitted to sub word driver band SWDB2. Signal lines transmitting boost signals BT0+ to BT3+ are provided extending in the column direction in memory block MBi. This is because the boost driver is provided for each memory block. By alternately providing sub word drivers 142a on both sides of sub word lines 141c, the pitch condition of sub word driver 142a is mitigated and sub word driver 142a is placed with a margin. The same configuration is provided in sub memory blocks SMB2 to SMB4.

In FIG. 10B, a bit line isolation gate 143j which is selectively rendered conductive in response to a bit line isolation signal BLI2i is provided for every other bit line pair 141a. Bit line isolation gate 143j includes transfer gates NT16 and NT17 formed of N channel MOS transistors and provided for bit lines BL and /BL. In the normal operation mode, a selected memory block is connected to a sense amplifier band, and a non-selected memory block paired with the selected memory block is isolated from the sense amplifier band. In the wafer level burn-in mode, all the memory blocks may be coupled to the sense amplifier bands with all the block selection signals driven to the selected state, and alternatively, the memory block and the sense amplifier band may be connected in accordance with the block selection signal when the burn-in is performed on a memory block basis.

Sense amplifier band SBi+1 includes a sense power supply line 143b extending in the row direction and transmitting array power supply voltage Vcca, a sense ground line 143c transmitting ground voltage Vss, and a bit line precharge voltage transmission line 143f extending in the row direction.

Sense amplifier band SBi+1 further includes a sense amplifier 143a provided corresponding to bit line isolation gate 143j. A prescribed number of sense amplifiers 143a are coupled commonly to sense amplifier power supply lines 143d and 143e extending in the row direction (on a sub memory block basis in FIG. 10B). For each of sense amplifiers 143a, there are provided a sense amplifier activation transistor 143g rendered conductive when a sense activation signal /PSEi+1 is activated, to couple sense power supply line 143b and sense amplifier power supply line 143d, and a sense activation transistor 143h provided corresponding to each of sense amplifier 143a and rendered conductive when a sense amplifier activation signal NSEi+1 is activated, to couple sense amplifier 143a and sense ground line 143c. Sense activation transistors 143g and 143h are formed of a P channel MOS transistor and an N channel MOS transistor, respectively.

For sense amplifier power supply line 143d and sense amplifier ground line 143e, there is provided a sense amplifier power supply line precharge/equalize circuit 143n activated, when a precharge designation signal BLEQi+1 is activated, to equalize and precharge sense amplifier power supply lines 143d and 143e to an intermediate voltage VBL level.

Sense amplifier 143a includes cross-coupled P channel MOS transistors PT11 and PT12, and cross-coupled N channel MOS transistors NT11 and NT12. Precharge/equalize circuit 143n includes an N channel MOS transistor NT20 turned on, when bit line equalize designation signal BLEQi+1 is activated, to electrically short-circuit sense amplifier power supply line 143d and sense amplifier ground line 143e, and N channel MOS transistors NT21 and NT22 rendered conductive, when bit line equalize designation signal BLEQi+1 is activated, to transmit intermediate voltage VBL to sense amplifier power supply line 143d and sense amplifier ground line 143e.

In sense amplifier 143a, when sense amplifier power supply line 143d is coupled to sense power supply line 143b in response to activation of sense amplifier activation signal /PSEi+1, cross-coupled P channel MOS transistors PT11 and PT12 are activated to drive a higher potential bit line of corresponding bit lines BL and /BL to the array power supply voltage (sense power supply voltage Vcca) level through the bit line isolation gate. Meanwhile, cross-coupled N channel MOS transistors NT11 and NT12 are activated, when sense amplifier ground line 143e is coupled to sense ground line 143c in response to activation of sense amplifier activation signal NSEi+1, to discharge a lower potential bit line of corresponding bit lines BL and /BL to the ground voltage level.

In sense amplifier band SBi+1, there is further provided a bit line precharge/equalize circuit 143i provided corresponding to each of sense amplifiers 143a activated, when bit line equalize designation signal BLEQi+1 is activated, to precharge and equalize sense nodes of sense amplifier 143a to the bit line precharge voltage VBL level. The sense nodes of sense amplifier 143a are nodes connecting to bit lines BL and /BL.

In the standby state, bit line isolation gate 143j is in the on state, and bit lines BL and /BL are precharged and equalized to the intermediate voltage VBL level by bit line precharge/equalize circuit 143i. Bit line precharge/equalize circuit 143i includes an N channel MOS transistor NT13 rendered conductive, when bit line equalize designation signal BLEQi+1 is activated, to electrically short-circuit the sense nodes of sense amplifiers 143a, and N channel MOS transistors NT14 and NT15 rendered conductive, when bit line equalize designation signal BLEQi+1 is activated, to transmit intermediate voltage VBL to the sense nodes of sense amplifier 143a.

Adjacent to bit line equalize circuit 143i, there is provided a column selection gate 143m coupling the sense nodes of the sense amplifier to an internal data line pair 143k in response to a column selection signal on a column selection line CSL. In sense amplifier band SBi+1, two pairs of internal data line pairs 143k are provided, and 2-bit memory cell data is transmitted in sense amplifier band SBi+1 in accordance with the column selection signal on column selection line CSL. Internal data bus line pair 143k transmits internal read data IO2i+1 and /IO2i+1 as well as IO2i+1, /IO2i+2. Column selection gate 143m includes N channel MOS transistors NT18 and NT19 rendered conductive, in response to the column selection signal on column selection line CSL, to connect the sense nodes to internal data lines of corresponding internal data bus line pairs 143k.

In sense amplifier band SBi+1, there is further provided an isolation gate 143j for isolating bit line pair 141a of memory block MBi+1 from a corresponding sense amplifier. Bit line isolation gates 143j are also provided for every other bit line pairs in memory block MBi+1. Bit line isolation gate 143j includes N channel MOS transistors NT16 and NT17 rendered conductive when bit line isolation designation signal BLI2i+1 is at the high level.

In the standby state, bit line isolation designation signals BLI2i and BLI2i+1 are both inactive and isolation gate 143j is on. In the active cycle, the bit line isolation designation signal for a non-selected memory block paired with a selected memory block is driven to the ground voltage Vss level. Bit line isolation designation signals BLI2i and BLI2i+1 are controlled by a memory block selection signal produced from an address signal. Activation/inactivation of bit line equalize designation signal BLEQi+1 is also controlled by block selection signals BSi and BSi+1 for memory blocks MBi and MBi+1.

In sense amplifier band SBi+1, sense amplifier activation signals /PSEi+1 and NSEi+1 are activated when one of memory blocks MBi and MBi+1 is selected. Therefore, row selection is performed on a memory block basis in the normal operation mode. In the wafer level burn-in mode, when block selection signal BSi is invalidated by a wafer burn-in signal and all main word lines 141b are driven to the selected state in all the memory blocks, all the bit line isolation designation signals are therefore driven to the high level. Since sense amplifiers are provided alternately, the bit line pair only extends over two memory blocks at most (terminated by the sense amplifier bands). All the sense amplifiers may be activated and a prescribed voltage may be applied to the bit lines and the cell plates or the like so as to perform the burn-in test. Voltage application in the burn-in is performed appropriately.

Therefore, as shown in FIGS. 10A and 10B, in the shared sense amplifier configuration in which row selection is performed on a memory block basis in the normal operation mode, even when boost signals BT0+ to BT3+ from the boost drivers rise slowly in the wafer level burn-in mode, sub word line 141c can be driven to the boosted voltage Vpp level at high speed in accordance with the drive signal in each sub word driver 142a. Boosted voltage Vpp is at a higher voltage level in the wafer level burn-in mode, and its upper limit value is determined by the dielectric breakdown voltage of the gate insulation film of memory cell transistor TR.

As described above, according to the first embodiment of the present invention, the drive signals generated in accordance with the wafer burn-in signals are applied to the gates of transistors for preventing the floating state of a sub word line. Even if a boost signal is applied to the sub word driver, a path through which the electric charges of the boost signal flow via the sub word driver is cut off reliably and the sub word line can be driven reliably to the boosted voltage level.

Second Embodiment

Figure 11:
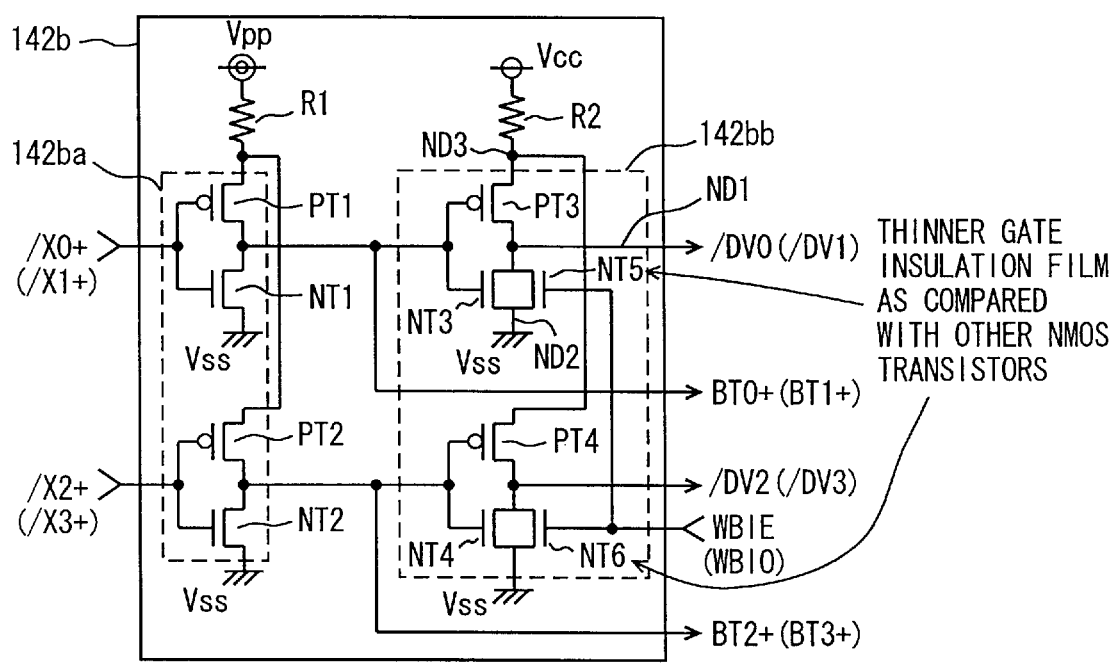
FIG. 11 shows a modification of the boost driver according to a second embodiment of the present invention.

FIG. 11 shows a configuration of a main part of a semiconductor memory device according to a second embodiment of the present invention. In FIG. 11, a configuration for generating boost signals BT0+ and BT2+ as well as drive signals /DV0 and /DV2 in a boost driver is shown. Boost signals BT1+1 and BT3+ as well as drive signals /DV1 and /DV3 are also generated from a boost driver having a similar configuration. Therefore, odd-numbered boost signals BT1+ and BT3+ as well as odd-numbered drive signals DV1 and /DV3 are shown in parenthesis in FIG. 11. Boost driver 142b shown in FIG. 11 is different from the boost driver shown in FIG. 9 in the point as described below. 1o Drive signal generator 142bb includes, instead of cut-off transistor CT, N channel MOS transistors NT5 and NT6 provided for respective drive signals /DV0 and /DV2 between the drive signal output nodes and the ground nodes. N channel MOS transistors NT5 and NT6 are rendered conductive in response to wafer burn-in signal WBIE. Since other parts are the same as the configuration shown in FIG. 9, corresponding parts are denoted by the same reference characters and description thereof will not be repeated.

N channel MOS transistors NT5 and NT6 are provided in parallel with N channel MOS transistors NT3 and NT4 rendered conductive in response to boost signals BT0+ and BT2+, and form a circuit for assisting in driving the drive signals /DV0 and /DV2 (or DV1 and /DV3) to the low level.

Also in the configuration shown in FIG. 11, when wafer burn-in signal WBIE or WBIO is at the high level, N channel MOS transistors NT5 and NT6 are turned on and drive signals /DV0 to /DV3 are forced to the low level in drive signal generator 142bb. Therefore, even if boost signals BT0+ to BT3+ rise to the high level gradually, drive signals /DV0 to /DV3 can be maintained reliably at the low level, an electric charge flow path in the sub word driver can be cut off, and the sub word line can be driven reliably to the boosted voltage Vpp level.

The gate insulation films of N channel MOS transistors NT5 and NT6 are made thinner than those of other MOS transistors NT1 to NT4. By thinning gate insulation films of N channel MOS transistors NT5 and NT6 to lower their threshold voltages, the switching speed of MOS transistors NT5 and NT6 is made higher and delay in the rises and falls of drive signals /DV0 to /DV3 is suppressed so that drive signals /DV0 to /DV3 are changed at high speed.

As described above, according to the second embodiment of the present invention, there is provided the N channel MOS transistors rendered conductive, in response to the wafer burn-in signal when drive signals are generated, to drive the drive signals /DV0 to /DV3 to the ground voltage level. When a sub word line is driven, the sub word line can be driven reliably to the boosted voltage Vpp level by maintaining drive signals /DV0 to /DV3 at the low level.

Other Applications

In the above description, a clock synchronous type DRAM is described as the semiconductor memory device as shown in FIG. 3. However, the present invention can be applied to any DRAM which operates asynchronously with a clock signal as far as the DRAM undergoes a burn-in test.

Furthermore, the word line has a hierarchical structure of a main word line and a sub word line.

In addition, the present invention is generally applicable to a semiconductor memory device in which a burn-in test is performed at a wafer level, and is also applicable to other semiconductor memory devices such as an SRAM (Static Random Access Memory).

As described above, according to the present invention, the word lines/sub word lines are forced to the low level in response to the wafer burn-in signal in the wafer level burn-in mode. Thus, a selected word line/sub word line can be driven reliably to boosted voltage Vpp and the burn-in can be performed reliably.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a boost signal generator for generating a boost signal;
   a drive signal generator for generating, in accordance with said boost signal, a drive signal changing complementarily to said boost signal, said drive signal generator including a gate circuit for driving said drive signal to a low level in response to a wafer burn-in signal designating a burn-in mode at a wafer level;
   a plurality of word lines each connecting a plurality of memory cells; and
   a plurality of word drivers coupled to said plurality of word lines for driving corresponding word lines to a selected state in accordance with at least said boost signal, each of said plurality of word drivers including a first drive transistor for transmitting said boost signal to a corresponding word line, and a second drive transistor for coupling said corresponding word line to a reference potential source node in response to said drive signal.

2. The semiconductor memory device according to claim 1, wherein said gate circuit of said drive signal generator includes
   an N channel insulation gate type field effect transistor connected between an output node for outputting said drive signal and a first node for receiving a potential at said low level and having a gate receiving said boost signal, and
   a cut-off transistor and a P channel insulation gate type field effect transistor connected in series with each other between said output node and a second node supplied with a high level voltage, said cut-off transistor turned off in response to activation of said wafer burn-in signal, and said P channel insulation gate type field effect transistor having a gate receiving said boost signal.

3. The semiconductor memory device according to claim 2, wherein said cut-off transistor has a gate insulation film thinner than said P channel insulation gate type field effect transistor has.

4. The semiconductor memory device according to claim 1, wherein said gate circuit of said drive signal generator includes
   a first N channel insulation gate type field effect transistor connected between an output node for outputting said drive signal and a first node for receiving a voltage at said low level and having a gate receiving said boost signal,
   a P channel insulation gate type field effect transistor connected between said output node and a second node receiving a voltage at a high level and having a gate receiving said boost signal, and
   a second N channel insulation gate type field effect transistor connected in parallel with said first N channel insulation gate type field effect transistor between said output node and said first node and turned on in response to activation of said wafer burn-in signal.

5. The semiconductor memory device according to claim 4, wherein said second N channel insulation gate type field effect transistor has a gate insulation film thinner than said first N channel insulation gate type field effect transistor has.

6. The semiconductor memory device according to claim 1, wherein each of said plurality of word drivers further includes a third drive transistor connected between said corresponding word line and said reference potential source node in parallel with said second drive transistor, and the first and third drive transistors receive a word line selection signal for selecting the corresponding word line at their gates to turn on complementarily to each other.

7. A semiconductor memory device, comprising:

a memory array having a plurality of memory cells provided in rows and columns and divided into a plurality of sub memory blocks in a row direction;

a plurality of main word lines provided commonly to the plurality of sub memory blocks of said memory array and each corresponding to a prescribed number of memory cell rows in each sub memory block;

a plurality of sub word lines provided corresponding to memory cell rows and connected to memory cells in corresponding rows in each of the sub memory blocks;

a plurality of sub word drivers provided corresponding to said plurality of sub word lines, each of the sub word drivers including a first drive transistor having a gate connected to a corresponding main word line of said plurality of main word lines and transmitting a corresponding boost signal out of a plurality of boost signals to a corresponding sub word line, and a second drive transistor connected between said corresponding sub word line and a reference node receiving a reference voltage from a reference potential source and having a gate receiving a corresponding drive signal out of a plurality of drive signals, said plurality of drive signals generated corresponding to said plurality of boost signals, and said plurality of boost signals selecting one sub word line from the prescribed number of sub word lines provided corresponding to one main word line in one sub memory block;

a boost signal generator for generating said plurality of boost signals; and a drive signal generator for generating said plurality of drive signals corresponding to said plurality of boost signals, said drive signal generator including a gate circuit provided corresponding to each of the drive signals, for maintaining a corresponding drive signal at a low level in response to a wafer burn-in signal.

8. The semiconductor memory device according to claim 7, further comprising:

a plurality of bit line pairs provided corresponding to the memory cell columns of said plurality of sub memory blocks; and a sense amplifier band including a plurality of sense amplifiers provided corresponding to said plurality of bit line pairs for sensing, amplifying and latching memory cell data on corresponding columns when activated, said sense amplifier band extending in a row direction of the memory cell rows, wherein said plurality of sub word drivers are provided in sub word driver bands provided between adjacent sub memory blocks in the row direction of said plurality of sub memory blocks, and said boost signal generator and said drive signal generator are provided in a crossing region of said sense amplifier band and each of said sub word driver bands.

9. The semiconductor memory device according to claim 7, further comprising a sub decode circuit for applying a plurality of sub decode signals to said boost signal generator in response to an address signal and said wafer burn-in signal, said boost signal generator including a circuit for generating said plurality of boost signals in accordance with said plurality of sub decode signals.

10. The semiconductor memory device according to claim 7, wherein said gate circuit of said drive signal generator include an N channel insulation gate type field effect transistor connected between an output node for outputting the corresponding drive signal and a first node for receiving a low level voltage of said corresponding drive signal and having a gate receiving a corresponding boost signal, and a cut-off transistor and a P channel insulation gate type field effect transistor connected in series with each other between said output node and a second node supplied with a high level voltage, said cut-off transistor turned off in response to said wafer burn-in signal, and said P channel insulation gate type field effect transistor having a gate receiving said corresponding boost signal.

11. The semiconductor memory device according to claim 10, wherein said cut-off transistor is provided commonly to the gate circuits responsive to said wafer burn-in signal, for generating said plurality of drive signals.

12. The semiconductor memory device according to claim 10, wherein said cut-off transistor has a gate insulation film thinner than said P channel insulation gate type field effect transistor has.

13. The semiconductor memory device according to claim 7, wherein said gate circuit of said drive signal generator includes a first N channel insulation gate type field effect transistor connected between an output node for outputting the corresponding drive signal and a first node for receiving a low level voltage of the corresponding drive signal and having a gate receiving a corresponding boost signal, a P channel insulation gate type field effect transistor connected between said output node and a second node supplied with a high level voltage and having a gate receiving said corresponding boost signal, and a second N channel insulation gate type field effect transistor connected in parallel with said first N channel insulation gate type field effect transistor between said output node and said first node and turned on in response to said wafer burn-in signal.

14. The semiconductor memory device according to claim 13, wherein said second N channel insulation gate type field effect transistor has a gate insulation film thinner than said first N channel insulation gate type field effect transistor has.

15. The semiconductor memory device according to claim 7, wherein said wafer burn-in signal includes at least first and second wafer level burn-in signals, said plurality of drive signals are divided into groups corresponding to said first and second wafer level burn-in signals, and each of the gate circuits receives a corresponding wafer level burn-in signal.

16. The semiconductor memory device according to claim 7, wherein said memory array are provided in plurality in alignment in a column direction, and a sub decode circuit for generating a plurality of sub decode signals corresponding to said plurality of boost signals in accordance with an address signal and said wafer burn-in signal is provided commonly to said plurality of memory arrays.

* * * * *

UNITED STATES PATENT AND TRADEMARK OFFICE
CERTIFICATE OF CORRECTION

PATENT NO. : 6,414,890 B1
DATED : July 23, 2002
INVENTOR(S) : Syrjärinne et al.

It is certified that error appears in the above-identified patent and that said Letters Patent is hereby corrected as shown below:

Column 1,
Line 30, "(ECEP)" should be -- (ECEF) --.

Column 4,
Lines 47 and 48 are a heading and should be italicized and preceded by a blank line.

Column 5,
Lines 15 and 16 are a heading and should be italicized and preceded by a blank line.
Line 67 is a heading and should be italicized and preceding by a blank line.

Column 6,
Line 5 is a heading and should be italicized and preceded by a blank line.

Column 7,
Line 53, "claim 1" should be -- claim 8 --.

Signed and Sealed this

Twenty-ninth Day of October, 2002

Attest:

JAMES E. ROGAN
*Attesting Officer*  *Director of the United States Patent and Trademark Office*

UNITED STATES PATENT AND TRADEMARK OFFICE
CERTIFICATE OF CORRECTION

PATENT NO. : 6,414,890 B2
DATED : Juily 2, 2002
INVENTOR(S) : Kazutami Arimoto et al.

It is certified that error appears in the above-identified patent and that said Letters Patent is hereby corrected as shown below:

This certificate supersedes Certificate of Correction issued October 29, 2002, the number was erroneously mentioned and should be vacated since no Certificate of Correction was granted.

Signed and Sealed this

Fifteenth Day of April, 2003

JAMES E. ROGAN
*Director of the United States Patent and Trademark Office*